US012581953B2

(12) United States Patent
Tarui et al.

(10) Patent No.: US 12,581,953 B2
(45) Date of Patent: Mar. 17, 2026

(54) MICROWAVE DEVICE HAVING A CONDUCTIVE HEAT SPREADER AND ANTENNA HAVING MICROWAVE DEVICE

(71) Applicant: Mitsubishi Electric Corporation, Tokyo (JP)

(72) Inventors: Yukinobu Tarui, Tokyo (JP); Makoto Kimura, Tokyo (JP); Katsumi Miyawaki, Tokyo (JP); Kiyoshi Ishida, Tokyo (JP); Hiroaki Matsuoka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 588 days.

(21) Appl. No.: 17/263,912

(22) PCT Filed: Sep. 12, 2018

(86) PCT No.: PCT/JP2018/033894
§ 371 (c)(1),
(2) Date: Jan. 28, 2021

(87) PCT Pub. No.: WO2020/054004
PCT Pub. Date: Mar. 19, 2020

(65) Prior Publication Data
US 2021/0233865 A1      Jul. 29, 2021

(51) Int. Cl.
*H01L 23/552* (2006.01)
*H01L 23/433* (2006.01)
(Continued)

(52) U.S. Cl.
CPC ........ *H01L 23/552* (2013.01); *H01L 23/4334* (2013.01); *H01L 23/481* (2013.01);
(Continued)

(58) Field of Classification Search
CPC ........... H01L 23/552; H01L 2924/3025; H01L 2924/302; H01L 23/60; H01L 23/66;
(Continued)

(56) References Cited

U.S. PATENT DOCUMENTS

| | | | | |
|---|---|---|---|---|
| 2003/0107060 A1* | 6/2003 | Ota | ........................ | H01L 23/645 257/E23.079 |
| 2007/0235215 A1* | 10/2007 | Bathan | .................... | H01L 24/97 257/E23.101 |

(Continued)

FOREIGN PATENT DOCUMENTS

| | | |
|---|---|---|
| JP | 2002-138205 A | 5/2002 |
| JP | 2008-515189 A | 5/2008 |

(Continued)

OTHER PUBLICATIONS

Author: adnanaqeel, Title: What is Multilayer PCB? Definition, Manufacturing & Applications, Mar. 2018, The Engineering Projects, [URL:https://www.theengineeringprojects.com/2018/03/multilayer-pcb.html] (Year: 2018).*

(Continued)

*Primary Examiner* — Christine S. Kim
*Assistant Examiner* — Tyler J Wiegand
(74) *Attorney, Agent, or Firm* — XSENSUS LLP

(57) ABSTRACT

A microwave device can include: a first multilayer resin substrate including a ground via hole; a semiconductor substrate at the first multilayer resin substrate and including a high frequency circuit; a conductive heat spreader at an opposite face of the semiconductor substrate from a face of the semiconductor substrate facing the first multilayer resin substrate; a resin over the first multilayer resin substrate and covering the semiconductor substrate and the heat spreader such that an opposite face of the heat spreader from a face of the heat spreader facing the semiconductor substrate is (Continued)

exposed as an exposed face; and a conductive film covering the resin and the heat spreader and touching the exposed face. The semiconductor substrate can include a ground through hole extending through the semiconductor substrate. The conductive film can be electrically connected to the ground via hole via the heat spreader and the ground through hole.

21 Claims, 7 Drawing Sheets

(51) Int. Cl.

| | |
|---|---|
| *H01L 23/48* | (2006.01) |
| *H01L 23/498* | (2006.01) |
| *H01L 23/66* | (2006.01) |
| *H01L 25/065* | (2023.01) |
| *H01Q 1/02* | (2006.01) |
| *H01Q 1/22* | (2006.01) |
| *H03F 3/24* | (2006.01) |

(52) U.S. Cl.
CPC ........ *H01L 23/49822* (2013.01); *H01L 23/66* (2013.01); *H01L 25/0655* (2013.01); *H01Q 1/02* (2013.01); *H01Q 1/2283* (2013.01); *H03F 3/245* (2013.01); *H01L 2223/6666* (2013.01); *H01L 2223/6677* (2013.01); *H01L 2223/6683* (2013.01)

(58) Field of Classification Search
CPC ......... H01L 2223/6683; H01L 23/4334; H01L 23/28; H01L 25/065; H01L 25/165; H01L 23/49822; H01L 25/16; H01L 23/00; H01L 23/29; H01L 23/5286; H01L 23/498; H01L 2223/6677; H01L 2924/00014; H01Q 1/2283; H01Q 21/065; H03F 3/245
See application file for complete search history.

(56) References Cited

U.S. PATENT DOCUMENTS

| | | | |
|---|---|---|---|
| 2009/0184403 A1 | 7/2009 | Wang et al. | |
| 2011/0140247 A1 | 6/2011 | Pagaila et al. | |
| 2012/0086109 A1* | 4/2012 | Kim ..................... | H01L 21/561 |
| | | | 257/659 |
| 2013/0256864 A1 | 10/2013 | Nagano et al. | |
| 2014/0028530 A1* | 1/2014 | Flores-Cuadras ........ | H01Q 9/42 |
| | | | 343/904 |
| 2017/0317002 A1* | 11/2017 | Kitahara ............. | H01L 23/3677 |
| 2020/0043881 A1* | 2/2020 | Lin ..................... | H01L 23/5226 |

FOREIGN PATENT DOCUMENTS

| | | | |
|---|---|---|---|
| JP | 2013-207132 A | | 10/2013 |
| JP | 2018133382 A | * | 8/2018 |
| WO | 2016/117196 A1 | | 7/2016 |

OTHER PUBLICATIONS

Materials and Methods for IC Package Assemblies; Packaging Design Review, Jelstad, Joseph; Aug. 2005; URL: https://sst.semiconductor-digest.com/2005/08/materials-and-methods-for-ic-package-assemblies/ (Year: 2005).*

International Search Report and Written Opinion mailed on Nov. 20, 2018, received for PCT Application PCT/JP2018/033894, Filed on Sep. 12, 2018, 11 pages including English Translation.

Notice of Reason for Refusal mailed on Jul. 14, 2019, received for JP Application 2019-505820, 8 pages including English Translation.

* cited by examiner

MICROWAVE DEVICE HAVING A CONDUCTIVE HEAT SPREADER AND ANTENNA HAVING MICROWAVE DEVICE

CROSS-REFERENCE TO RELATED APPLICATION

The present application is based on PCT filing PCT/JP2018/033894, filed Sep. 12, 2018, the entire contents of which are incorporated herein by reference.

FIELD

The present invention relates to a microwave device including a heat spreader and also relates to an antenna.

BACKGROUND

A power amplifier module disclosed in Patent Literature 1 is a microwave device and includes a power amplifier, a surface acoustic wave duplexer, an insulating resin covering the power amplifier and the surface acoustic wave duplexer that are disposed on a package substrate, and a conductive shield covering a surface of the insulating resin. Each of the power amplifier and the surface acoustic wave duplexer is provided with, on a surface opposite from its surface that faces the package substrate, a metal layer that is electrically connected to the conductive shield by wires. Heat generated by the power amplifier is dissipated via the metal layer and is also dissipated from the conductive shield by being transmitted from the metal layer to the conductive shield via the wires, so that the power amplifier module disclosed in Patent Literature 1 has an enhanced heat dissipation effect.

CITATION LIST

Patent Literature

Patent Literature 1: PCT International Publication No. 2016/117196

SUMMARY

Technical Problem

While the power amplifier module disclosed in Patent Literature 1 has the measures taken against heat generated by the power amplifier, the power amplifier module does not, however, have any measures against cavity resonance inside the conductive shield, which serves as a covering. Therefore, unstable operations may occur depending on the operating frequency.

The present invention has been made in view of the above, and an object of the present invention is to obtain a microwave device that is capable of having stable operations.

Solution to Problem

In order to solve the above-stated problem and achieve the object, a microwave device according to the present invention includes: a first multilayer resin substrate including a ground via hole; a semiconductor substrate disposed at one surface of the first multilayer resin substrate and including a high frequency circuit electrically connected to the first multilayer resin substrate; and a conductive heat spreader disposed at an opposite face of the semiconductor substrate from a face of the semiconductor substrate that faces the first multilayer resin substrate, the heat spreader being electrically connected to the semiconductor substrate. The microwave device further includes: a resin disposed over the one surface of the first multilayer resin substrate and covering the semiconductor substrate and the heat spreader such that an opposite face of the heat spreader from a face of the heat spreader that faces the semiconductor substrate is exposed as an exposed face; and a conductive film covering the resin and the heat spreader and in contact with the exposed face. The semiconductor substrate includes a ground through hole extending through the semiconductor substrate in a stacking direction in which the first multilayer resin substrate, the semiconductor substrate, and the heat spreader are stacked, and the conductive film is electrically connected to the ground via hole of the first multilayer resin substrate via the heat spreader and a ground through hole of the semiconductor substrate.

Advantageous Effects of Invention

The microwave device obtained according to the present invention achieves an effect of being capable of having stable operations.

BRIEF DESCRIPTION OF DRAWINGS

FIG. 3 is a sectional view of the microwave device illustrated in FIG. 1, as viewed in the direction of arrow B of FIG. 1.

FIG. 4 is a sectional view of an antenna including the microwave device illustrated in FIG. 1.

DESCRIPTION OF EMBODIMENTS

With reference to the drawings, a detailed description is hereinafter provided of microwave devices and antennas according to embodiments of the present invention. It is to be noted that the present invention is not limited to the embodiments.

Embodiment

Figure 1:
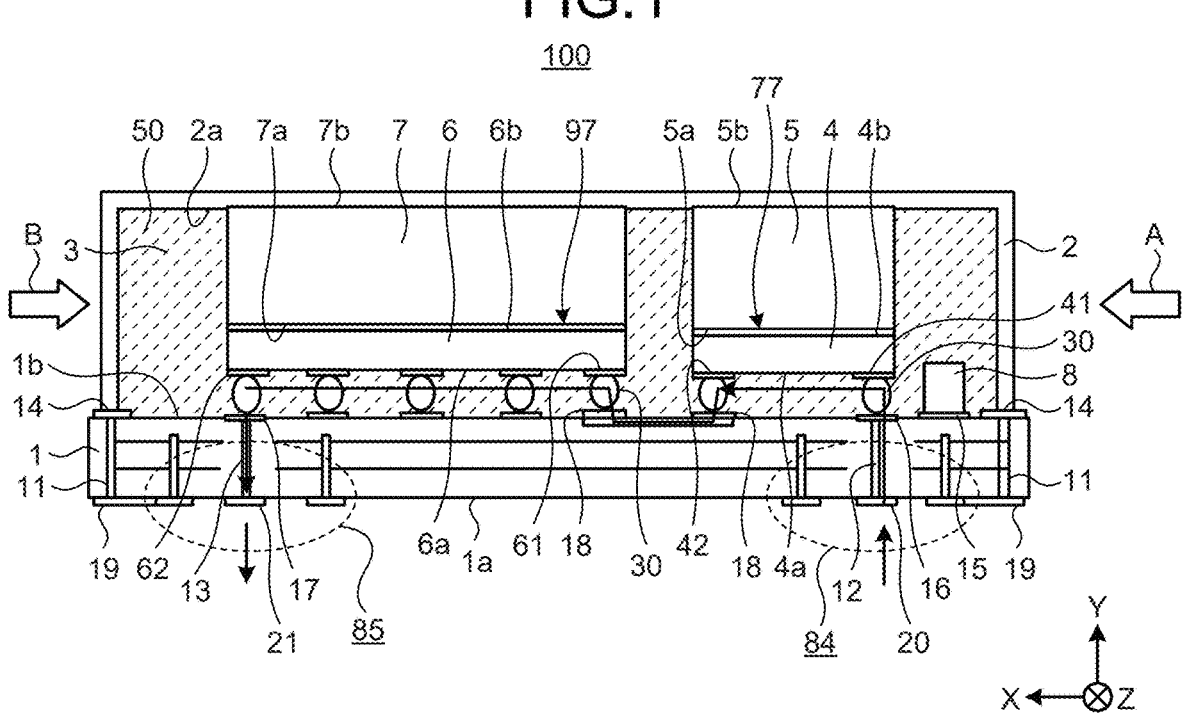
FIG. 1 is a sectional view of a microwave device according to an embodiment of the present invention.
Figure 2:
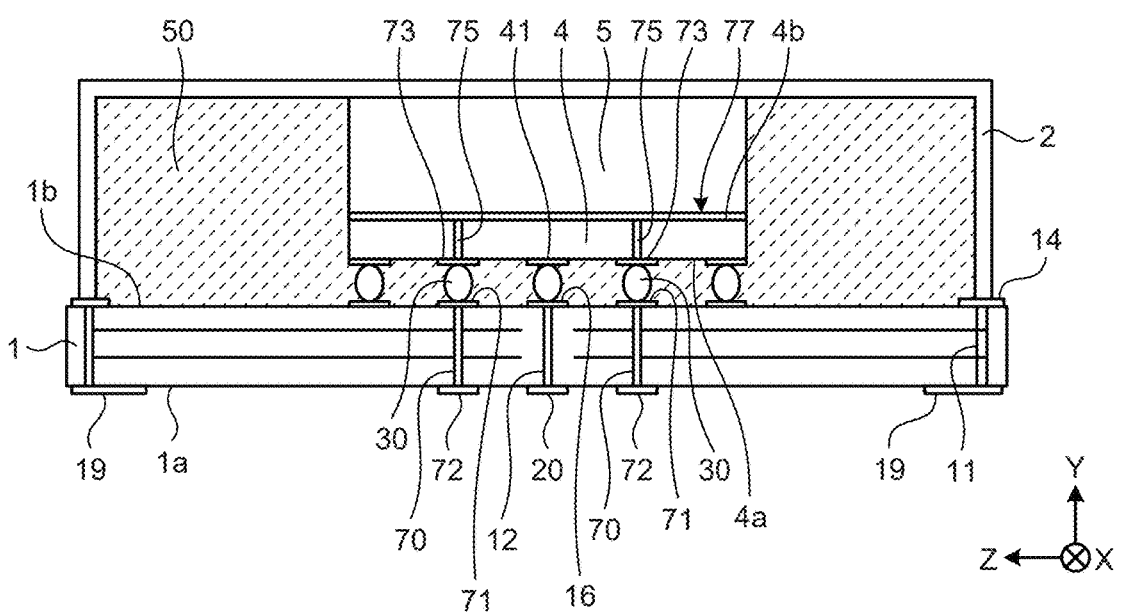
FIG. 2 is a sectional view of the microwave device illustrated in FIG. 1, as viewed in the direction of arrow A of FIG. 1.
Figure 3:
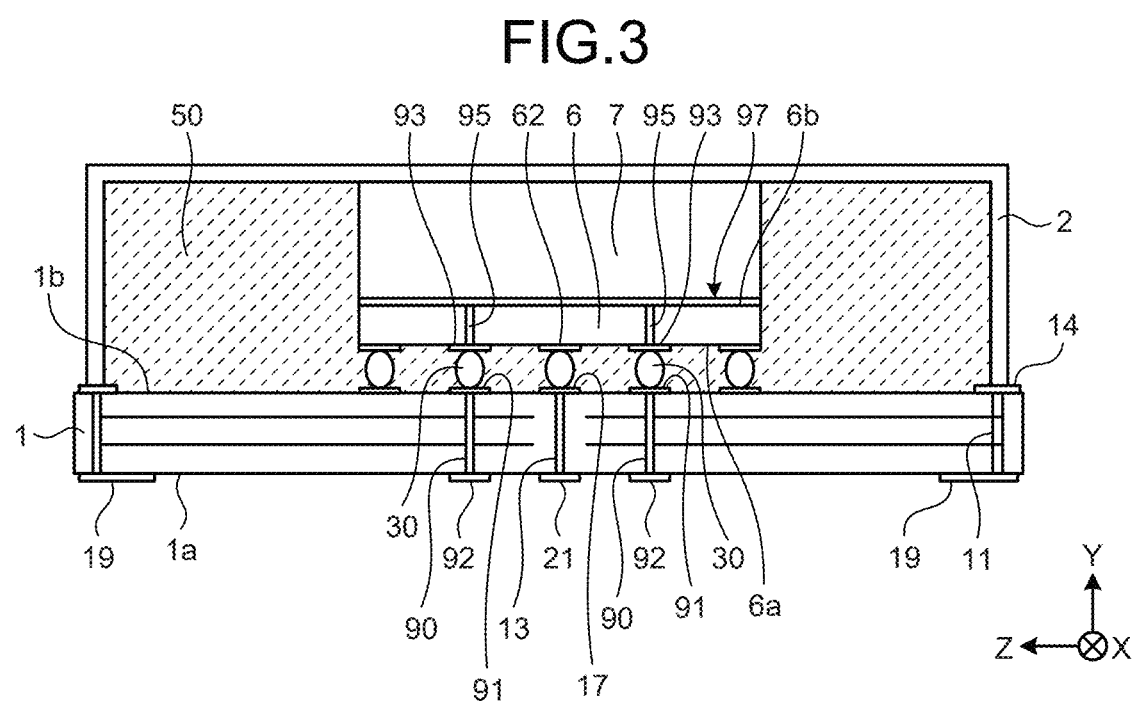
Figure 4:
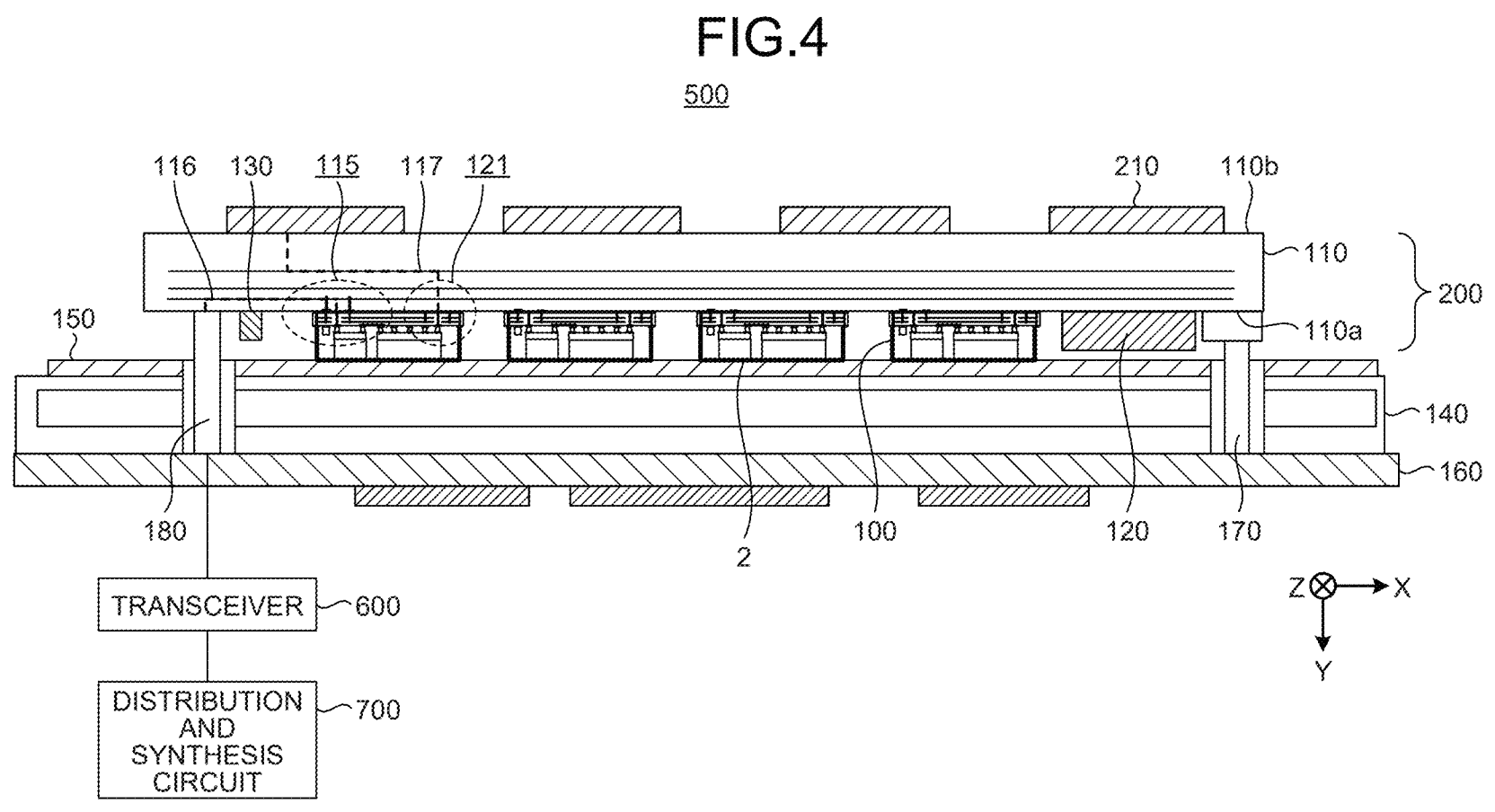
Figure 5:
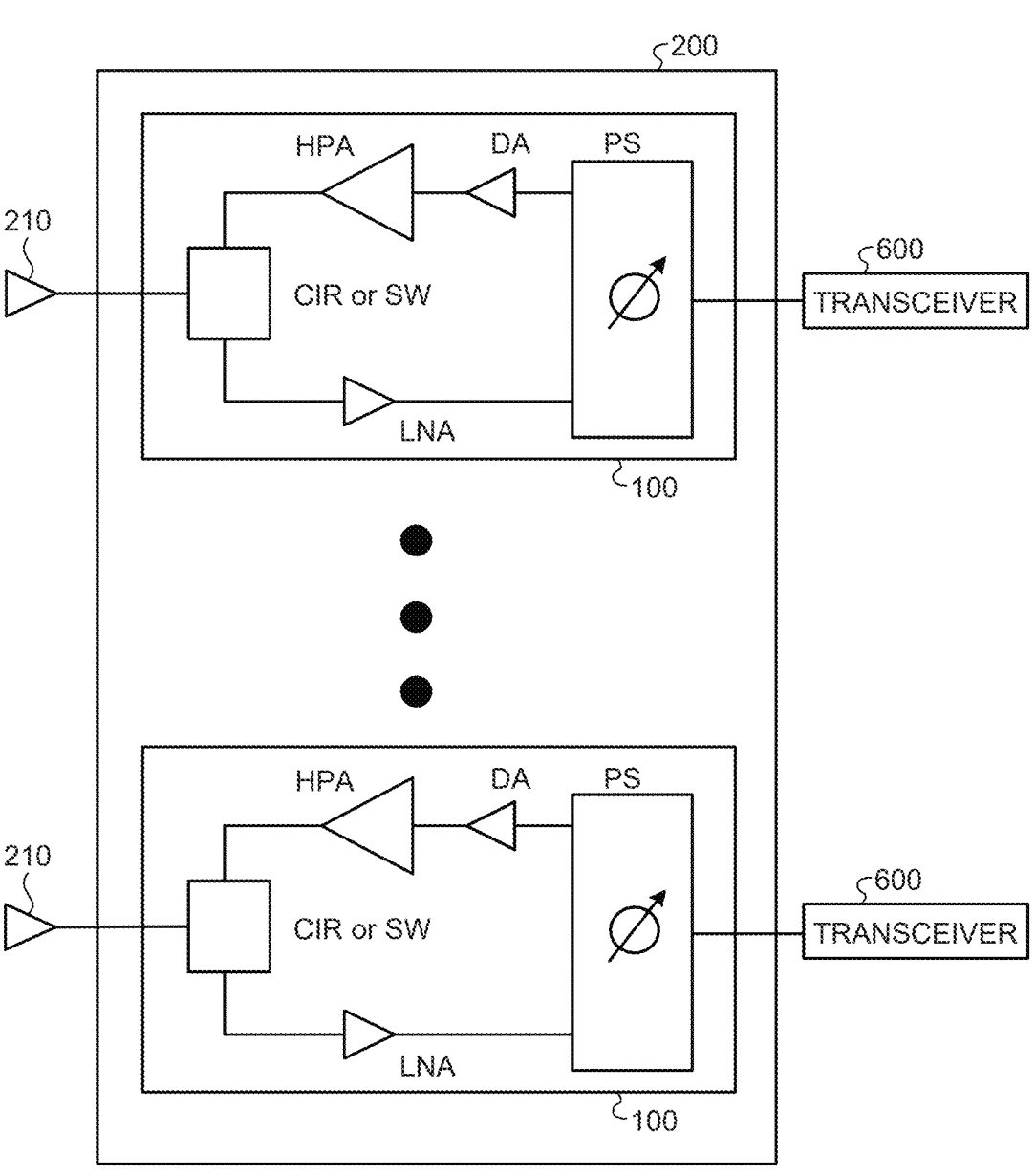
FIG. 5 is a functional block diagram of the microwave device illustrated in FIG. 1.

FIG. 1 is a sectional view of a microwave device according to an embodiment of the present invention. FIG. 2 is a sectional view of the microwave device illustrated in FIG. 1, as viewed in the direction of arrow A of FIG. 1. FIG. 3 is a sectional view of the microwave device illustrated in FIG. 1, as viewed in the direction of arrow B of FIG. 1. FIG. 4 is a sectional view of an antenna including the microwave device illustrated in FIG. 1. FIG. 5 is a functional block diagram of the microwave device illustrated in FIG. 1.

As illustrated in FIG. 1, a microwave device 100 includes a multilayer resin substrate 1 that is a first multilayer resin substrate for a device, an integrated circuit (IC) 4 that is a high heat generating radio frequency (RF) device, and a conductive heat spreader 5 thermally connected to the IC 4.

The microwave device 100 also includes an IC 6 that is a high heat generating RF device, a conductive heat spreader 7 thermally connected to the IC 6, and a chip component 8 surface mounted on the multilayer resin substrate 1.

Each of the ICs 4 and 6 is an example of a high frequency circuit. In the present embodiment, the IC 4 is a driver amplifier (DA). The IC 6 is a high-power amplifier (HPA). The high frequency circuits of the present embodiment are provided at one surface of the multilayer resin substrate 1. The high frequency circuits are configured as functional circuits on a semiconductor substrate, as represented by an IC chip that would be mounted to be electrically connected to the multilayer resin substrate 1. The chip component 8 is a bypass capacitor that reduces or eliminates RF superposed waves.

The multilayer resin substrate 1 has a first plate surface 1a, which is one Y-axis end face of the multilayer resin substrate 1, and the second plate surface 1b, which is the other Y-axis end face of the multilayer resin substrate 1. For right-handed XYZ coordinates in FIG. 1, the ICs 4 and 6 are arranged in an X-axis direction, the first and second plate surfaces 1a and 1b of the multilayer resin substrate 1 are arranged in a Y-axis direction, and a Z-axis direction is orthogonal to both the X-axis direction and the Y-axis direction.

Formed in the multilayer resin substrate 1 are a plurality of ground via holes 11 near the outer periphery of the multilayer resin substrate 1, inner ground via holes 70 and 90 for grounding the high frequency circuits, a signal via hole 12, and a signal via hole 13. A ground pattern 14 electrically connected to one Y-axis end of each of the plurality of ground via holes 11, ground pads 71 connected to the ground via holes 70, ground pads 91 connected to the ground via holes 90, a signal line 15 electrically connected to the chip component 8, a pad 16 electrically connected to one Y-axis end of the signal via hole 12, a pad 17 electrically connected to one Y-axis end of the signal via hole 13, and a plurality of pads 18 are provided at the second plate surface 1b of the multilayer resin substrate 1.

A ground pattern 19 electrically connected to the other Y-axis end of each of the ground via holes 11, ground terminals 72 connected to the ground via holes 70, ground terminals 92 connected to the ground via holes 90, a signal input and output terminal 20 electrically connected to the other Y-axis end of the signal via hole 12, and a signal input and output terminal 21 electrically connected to the other Y-axis end of the signal via hole 13 are provided at the first plate surface 1a of the multilayer resin substrate 1. The signal input and output terminals 20 and 21 are connected to signal input and output terminals of another substrate that is disposed to face the first plate surface 1a of the multilayer resin substrate 1. In the present embodiment, the ground pattern 19 is a conductor pattern of continuous loop shape provided along the outer peripheral portion of the first plate surface 1a of the multilayer resin substrate 1. In the present embodiment, the ground pattern 14 is a conductor pattern of continuous loop shape provided along the outer peripheral portion of the second plate surface 1b of the multilayer resin substrate 1. Depending on the implementation, each of the ground patterns 19 and 14 could vary, and they could be, for example, the conductor pattern of continuous loop shape or a plurality of discrete ground terminals.

The plurality of ground via holes 11 are formed near the outer periphery of the multilayer resin substrate 1 to surround the signal line 15, the pads 16, 17, and 18, the signal pads such as the signal input and output terminals 20 and 21, and the signal via holes 12 and 13.

Types of the signal line 15 include an input RF line, a gate bias supply line, an output RF line, and a drain bias supply line.

One Y-axis end face 4a of the IC 4 is provided with two input and output terminals 41 and 42. The input and output terminal 41 is electrically connected to the pad 16 via a fine bonding member 30. The input and output terminal 42 is electrically connected to the pad 18 via the fine bonding member 30. An example of the fine bonding member 30 that can be given is a conductive copper pillar or a solder ball.

As illustrated in FIG. 2, ground through holes 75 are provided in the IC 4. In other words, the IC 4 has the ground through holes 75 extending through the IC 4 in a stacking direction in which the multilayer resin substrate 1, the IC 4, and the heat spreader 5 are stacked. Ground pads 73 are provided at the one Y-axis end face 4a of the IC 4. A ground plane 77 that is a metal layer is provided at the other Y-axis end face 4b of the IC 4. The plurality of ground via holes 70 are formed in the multilayer resin substrate 1. The ground pads 71 electrically connected to respective Y-axis ends of the ground via holes 70 are provided at the second plate surface 1b of the multilayer resin substrate 1.

The ground through holes 75 are electrically connected to the ground pads 73 and to the ground plane 77. The ground pads 73 are electrically connected to the ground terminals 72 on the first plate surface 1a of the multilayer resin substrate 1 via fine bonding members 30, the ground pads 71, and the ground via holes 70.

The heat spreader 5 is provided on the ground plane 77 at the other Y-axis end face 4b of the IC 4. The IC 4 is thermally and electrically connected to one Y-axis end face 5a of the heat spreader 5. In other words, the heat spreader 5 is provided on the face of the IC 4 opposite from its face facing the multilayer resin substrate 1 with the ground plane 77 therebetween.

One Y-axis end face 6a of the IC 6 is provided with two input and output terminals 61 and 62. The input and output terminal 61 is electrically connected to the pad 18 via the fine bonding member 30. The input and output terminal 62 is electrically connected to the pad 17 via the fine bonding member 30.

As illustrated in FIG. 3, ground through holes 95 are provided in the IC 6. In other words, the IC 6 has the ground through holes 95 extending through the IC 6 in the stacking direction in which the multilayer resin substrate 1, the IC 6, and the heat spreader 7 are stacked. Ground pads 93 are provided at the one Y-axis end face 6a of the IC 6. A ground plane 97 that is a metal layer is provided at the other Y-axis end face 6b of the IC 6. The plurality of ground via holes 90 are formed in the multilayer resin substrate 1. The ground pads 91 electrically connected to respective Y-axis ends of the ground via holes 90 are provided at the second plate surface 1b of the multilayer resin substrate 1.

The ground through holes 95 are electrically connected to the ground pads 93 and to the ground plane 97. The ground pads 93 are electrically connected to the ground terminals 92 on the first plate surface 1a of the multilayer resin substrate 1 via fine bonding members 30, the ground pads 91, and the ground via holes 90.

The heat spreader 7 is provided on the ground plane 97 at the other Y-axis end face 6b of the IC 6. In other words, the heat spreader 7 is provided at the face of the IC 6 opposite from its face facing the multilayer resin substrate 1. The IC 6 is thermally and electrically connected to one Y-axis end face 7a of the heat spreader 7.

The ICs 4 and 6 provided to make contact with the heat spreaders 5 and 7 respectively are joined to the multilayer resin substrate 1, and a molded resin 50 is formed over the multilayer resin substrate 1 joined to the ICs 4 and 6. The molded resin 50 is formed so as to have within itself the ICs 4 and 6, the heat spreaders 5 and 7, the chip component 8, the signal line 15, and the pads 16, 17, and 18.

The outer peripheral surface of the IC 4 is covered with the molded resin 50 except for the other Y-axis end face 4b of the IC 4. The outer peripheral surface of the IC 6 is covered with the molded resin 50 except for the other Y-axis end face 6b of the IC 6. The outer peripheral surface of the heat spreader 5 is covered with the molded resin 50 except for the one Y-axis end face 5a and the other Y-axis end face 5b of the heat spreader 5.

The outer peripheral surface of the heat spreader 7 is covered with the molded resin 50 except for the one Y-axis end face 7a and the other Y-axis end face 7b of the heat spreader 7. The other Y-axis end face 5b of the heat spreader 5 is not covered by the molded resin 50 but is exposed. The other Y-axis end face 7b of the heat spreader 7 is not covered by the molded resin 50 but is exposed. This means that the other Y-axis end face 5b of the heat spreader 5 and the other Y-axis end face 7b of the heat spreader 7 are exposed as exposed faces at the molded resin 50. The molded resin 50 is provided over one surface of the multilayer resin substrate 1 and covers the ICs 4 and 6 and the heat spreaders 5 and 7 while having the exposed faces of the heat spreaders 5 and 7.

A method for forming the molded resin 50 may be such that a resin material is molded to surround the ICs 4 and 6 and the heat spreaders 5 and 7 without creation of a stepped face at a Y-axis inner face 2a of a conductive film 2. Alternatively, after the resin material is molded to surround the ICs 4 and 6 and the heat spreaders 5 and 7, the other end faces 5b and 7b of the heat spreaders 5 and 7 may be exposed by grinding such that a molded resin 50 has an end face roughly even with the respective upper end faces of the heat spreaders 5 and 7 at the inner face 2a or by grinding such that an end face of the molded resin 50 and respective upper end faces of the heat spreaders 5 and 7 at the inner face 2a are flat.

The conductive film 2 is formed on the surfaces of the molded resin 50 and the heat spreaders 5 and 7. In other words, the conductive film 2 covers the molded resin 50 and the heat spreaders 5 and 7 and is in contact with the exposed faces of the heat spreaders 5 and 7. The conductive film 2 is a conductive coating made, for example, by electroless plating or with a conductive adhesive. Nickel (Ni) and silver can be included in examples of a material of a plated coating, and an epoxy material including silver particles can be included in examples of the conductive adhesive. When the electroless plating is used to make the conductive film 2, a conductive adhesive or a thin conductive metal sheet may be placed in contact with an upper surface of each of boundary regions where the end face of the molded resin 50 at the inner face 2a adjoins the upper end faces of the heat spreaders 5 and 7 for enhancing electrical connections and electromagnetic shielding functions at the boundary regions where the end face of the molded resin 50 at the inner face 2a adjoins the upper end faces of the heat spreaders 5 and 7.

An area denoted by reference character "3" is a space that is defined between the multilayer resin substrate 1 and the conductive film 2 and is filled with the molded resin 50.

The conductive film 2 of the microwave device 100 having the above-described configuration is electrically connected to the ground via holes 70 of the multilayer resin substrate 1 via the heat spreader 5 and the ground through holes 75 of the IC 4. The conductive film 2 is also electrically connected to the ground via holes 90 of the multilayer resin substrate 1 via the heat spreader 7 and the ground through holes 95 of the IC 6.

This means that for the microwave device 100, the ground pattern 19 on the first plate surface 1a of the multilayer resin substrate 1, the ground via holes 70 of the multilayer resin substrate 1, the ground pads 71 on the multilayer resin substrate 1, the ground terminals 72 on the multilayer resin substrate 1, the ground via holes 90 of the multilayer resin substrate 1, the ground pads 91 on the multilayer resin substrate 1, the ground terminals 92 on the multilayer resin substrate 1, the ground pads 73 on the IC 4, the ground through holes 75 of the IC 4, the ground plane 77 on the IC 4, the ground pads 93 on the IC 6, the ground through holes 95 of the IC 6, the ground plane 97 on the IC 6, the heat spreader 5, the heat spreader 7, and the conductive film 2 are all electrically connected and kept at the same potential as a ground potential that is a potential of the ground pattern 19.

The conductive film 2 provided at the multilayer resin substrate 1 is thermally connected at the inner face 2a to the other Y-axis end face 5b of the heat spreader 5 and to the other Y-axis end face 7b of the heat spreader 7. Moreover, the conductive film 2 provided at the multilayer resin substrate 1 is electrically connected at the Y-axis end of the conductive film 2 to the ground pattern 14.

For the microwave device 100 thus configured, an RF signal is input to the signal input and output terminal 20. The RF signal input as a transmitting signal to the signal input and output terminal 20 is input to the IC 4 via the signal via hole 12, the pad 16, the fine bonding member 30, and the input and output terminal 41. The RF signal input to the IC 4 is transmitted to the IC 6 via the input and output terminal 42, the fine bonding members 30, and the pads 18. The RF signal input to the IC 6 via the input and output terminal 61 is transmitted to the signal input and output terminal 21 via the input and output terminal 62, the fine bonding member 30, the pad 17, and the signal via hole 13.

The pad 16, the signal via hole 12, and the signal input and output terminal 20 compose a signal terminal unit 84 of coaxial structure. The pad 17, the signal via hole 13, and the signal input and output terminal 21 compose a signal terminal unit 85 of coaxial structure.

As illustrated in FIG. 4, the antenna 500 includes a microwave module 200, an elastic heat dissipation sheet 150, a heat sink 140, and a control board 160. The heat dissipation sheet 150 has a smaller elastic modulus than the conductive film 2 of the microwave device 100. The microwave module 200, the heat dissipation sheet 150, the heat sink 140, and the control board 160 are arranged in the Y-axis direction in this order.

The microwave module 200 includes a multilayer resin substrate 110 that is a second multilayer resin substrate for a module, a plurality of the microwave devices 100, a control IC 120, a chip component 130, and a plurality of antenna elements 210.

The plurality of the microwave devices 100, the control IC 120, and the chip component 130 are provided at one Y-axis end face 110a of the multilayer resin substrate 110. The control IC 120 and the chip component 130 are surface mounted on the multilayer resin substrate 110. An example of the chip component 130 that can be given is a resistor or a capacitor. The plurality of antenna elements 210 are provided at the other Y-axis face 110b of the multilayer resin substrate 110.

The heat dissipation sheet 150 is in contact with the heat sink 140 at its one Y-axis end face and is in contact with the conductive film 2 of each of the plurality of the microwave devices 100 at its other Y-axis end face. The heat dissipation sheet 150 is a highly elastic, high thermal conductivity sheet. A silicon rubber that has a high thermal conductivity material such as carbon or silver embedded can be included in examples of a material of the heat dissipation sheet 150.

The multilayer resin substrate 110 and the control board 160 are connected to each other by a power and control connector 170 and an RF connector 180 that extend through the heat dissipation sheet 150 and the heat sink 140. The power and control connector 170 is a first connector, and the RF connector 180 is a second connector.

The multilayer resin substrate 110 is fastened to the heat sink 140 with a screw or the like while experiencing a pressure in the Y-axis direction. Accordingly, the conductive film 2 of each microwave device 100 is pressed against the elastic heat dissipation sheet 150. Consequently, the conductive film 2 of each microwave device 100, the heat dissipation sheet 150, and the heat sink 140 are thermally connected.

The multilayer resin substrate 110 includes a signal terminal unit 115 of coaxial structure, a signal terminal unit 121 of coaxial structure, an RF transmission line 116, and an RF transmission line 117. The RF transmission lines 116 and 117 are inner layer signal lines. The RF connector 180 is connected to the microwave devices 100 by the RF transmission line 116 and the signal terminal unit 115. The antenna elements 210 are connected to the microwave devices 100 by the RF transmission line 117 and the signal terminal unit 121.

Generation of power and a control signal that are to be supplied to the microwave module 200 takes place at the control board 160. The power and the control signal are input to the microwave devices 100 on the multilayer resin substrate 110 via the power and control connector 170.

Transmitting input signals and receiving output signals that are RF signals of the microwave module 200 are transmitted via the RF connector 180 between the antenna element 210 and a transceiver 600 or between the antenna element 210 and a distribution and synthesis circuit 700. The transceiver 600 and the distribution and synthesis circuit 700 may be connected in any order. While the transceiver 600 is provided separately from the control board 160 here, the transceiver 600 may be integral with the control board 160.

An RF transmitting signal output from the transceiver 600 is transmitted to the signal input and output terminal 20 illustrated in FIG. 1 via the RE connector 180, the RF transmission line 116, and the signal terminal unit 115. The RF transmitting signal is output from the signal input and output terminal 21 illustrated in FIG. 1 and is transmitted to the antenna element 210 via the RF transmission line 117 to be output from the antenna element 210.

An RF receiving signal received by the antenna element 210 is transmitted to the signal input and output terminal 21, which is illustrated in FIG. 1, via the RF transmission line 117 and is then transmitted to the transceiver 600 via the signal input and output terminal 20, which is illustrated in FIG. 1, and the RF connector 180.

As illustrated in FIG. 5, the microwave module 200 includes the plurality of the microwave devices 100. Each of the microwave devices 100 includes a low-noise amplifier (LNA), a circulator (CIR), a phase shifter (PS), and others in addition to the above-described HPA and the above-described DA. The RF transmitting signal output from the transceiver 600 is transmitted to the antenna element 210 via the PS, the DA, the HPA, and the CIR. The RF receiving signal received by the antenna element 210 is transmitted to the transceiver 600 via the CIR, the LNA, and the PS. It is to be noted here that an antenna-side duplexer circuit (transmit/receive switching circuit) may use a switch in place of the CIR. The switch is denoted by "SW" in FIG. 5.

Figure 6:
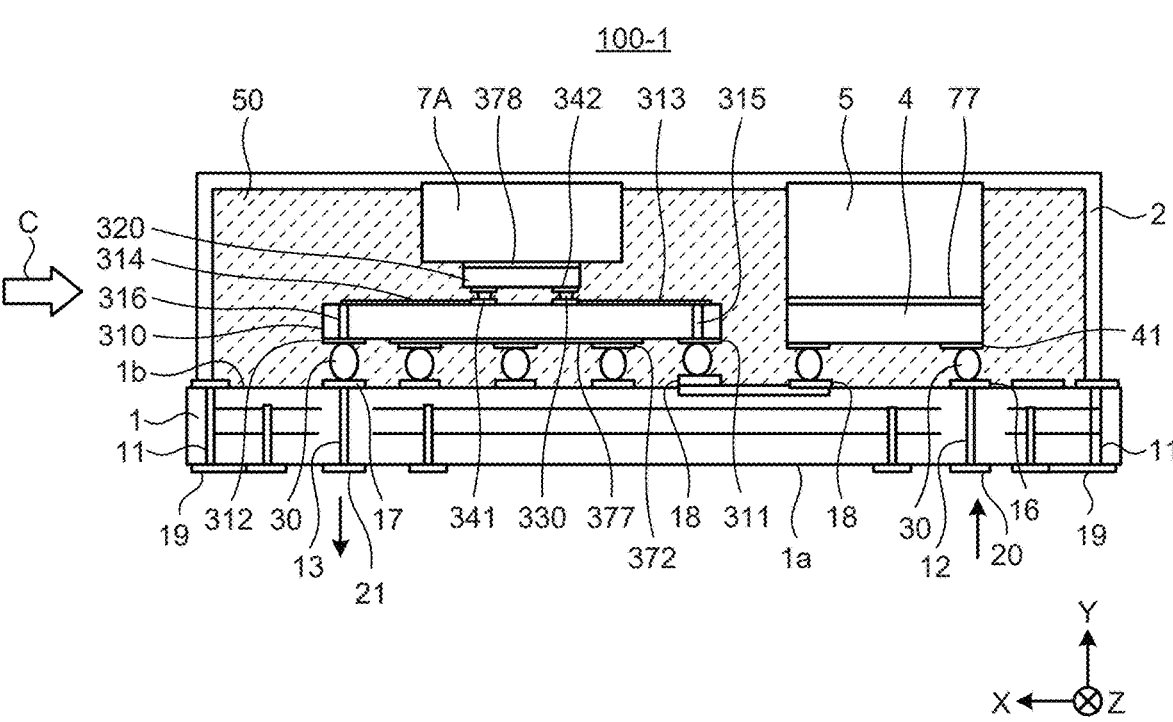
FIG. 6 is a diagram illustrating a variation of the microwave device illustrated in FIG. 1.
Figure 7:
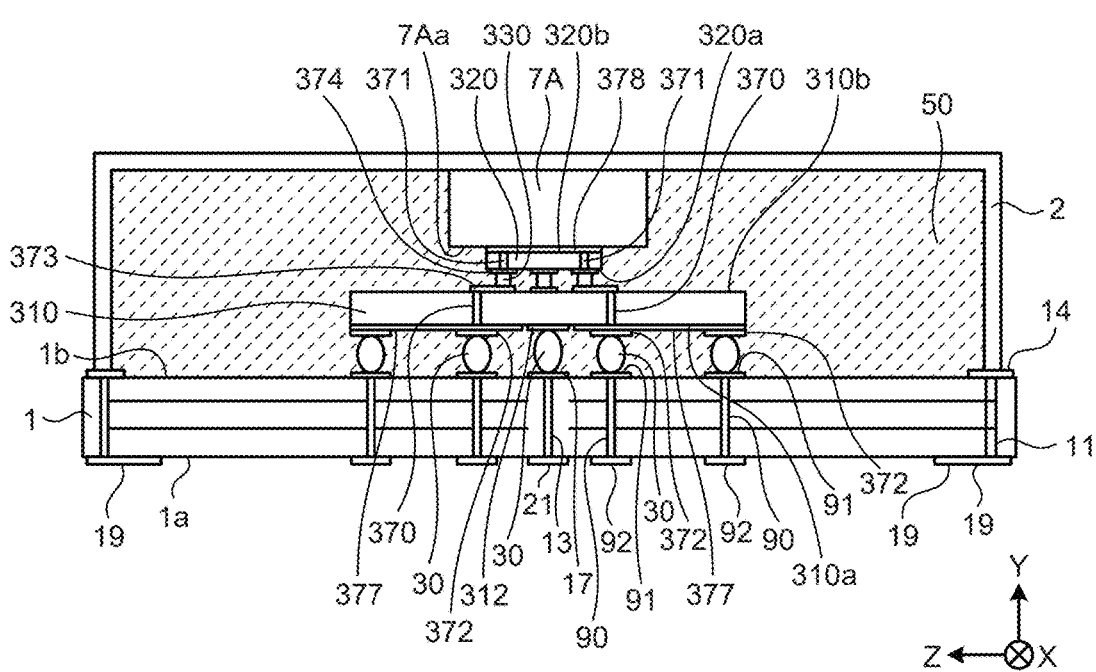
FIG. 7 is a sectional view of the microwave device illustrated in FIG. 6, as viewed in the direction of arrow C of FIG. 6.
Figure 8:
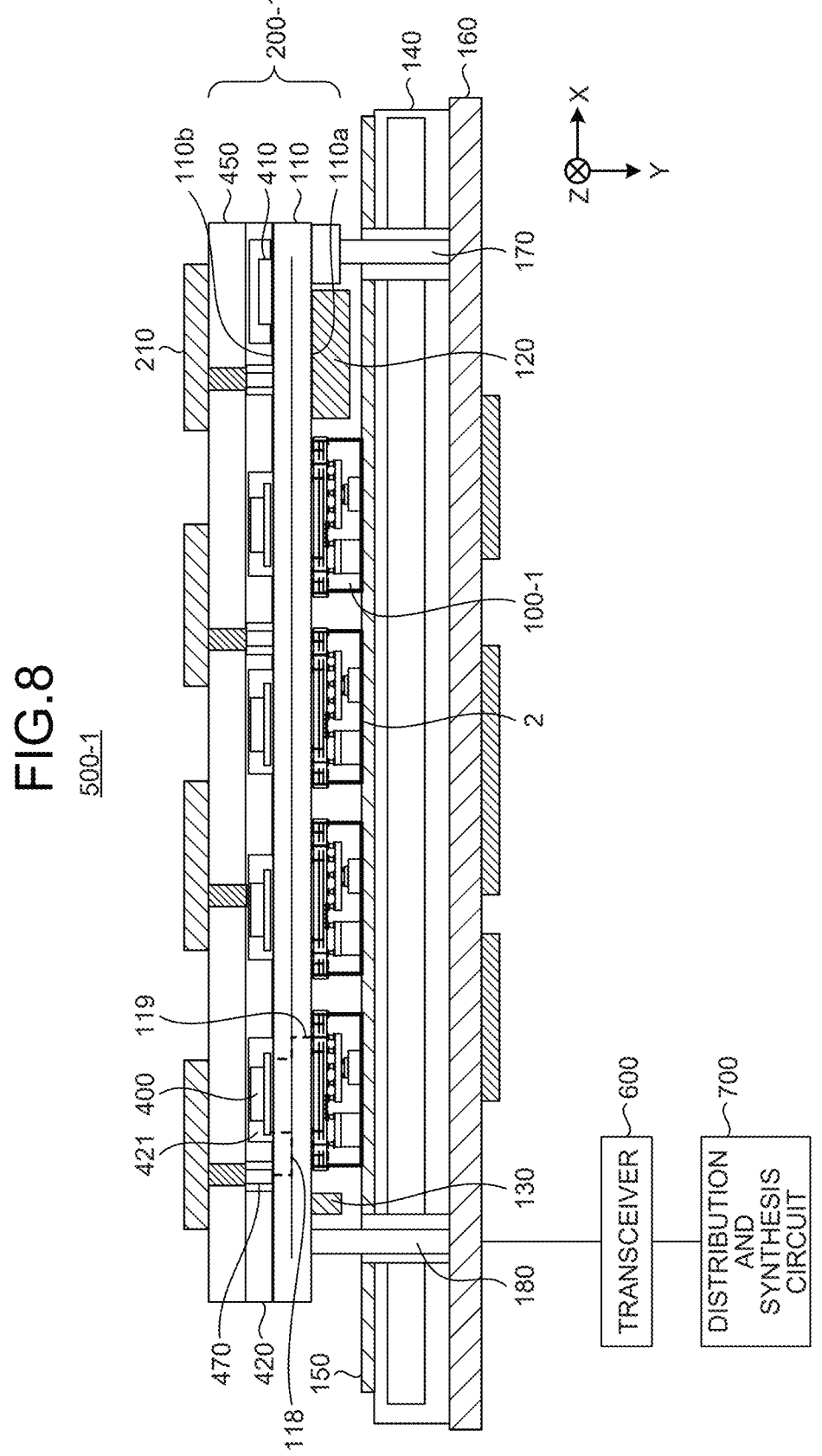
FIG. 8 is a diagram illustrating a variation of the antenna illustrated in FIG. 4.

FIG. 6 is a diagram illustrating a variation of the microwave device illustrated in FIG. 1. FIG. 7 is a sectional view of the microwave device illustrated in FIG. 6, as viewed in the direction of arrow C of FIG. 6. FIG. 8 is a diagram illustrating a variation of the antenna illustrated in FIG. 4.

The microwave device 100-1 illustrated in FIG. 6 is a hybrid IC including a plurality of substrates. The microwave device 100-1 illustrated in FIG. 6 differs from the microwave device 100 illustrated in FIG. 1 in that the microwave device 100-1 does not include the IC 6 and the heat spreader 7 but includes a heat spreader 7A, a low-cost semiconductor substrate 310 that is a first semiconductor substrate not including a transistor, and a high-cost semiconductor substrate 320 that is a second semiconductor substrate including a transistor. The high-cost semiconductor substrate 320 includes a high frequency circuit that includes the transistor, which uses, for example, gallium nitride as a material. The low-cost semiconductor substrate 310 includes a matching circuit that is a high frequency circuit using, for example, gallium arsenide as a material. In other words, the first semiconductor substrate is provided at one surface of the multilayer resin substrate 1 and includes a high frequency circuit that is electrically connected to the multilayer resin substrate 1. The second semiconductor substrate is provided at an opposite face of the low-cost semiconductor substrate 310 from the face of the low-cost semiconductor substrate 310 that faces the multilayer resin substrate 1, and includes a high frequency circuit that is electrically connected to the low-cost semiconductor substrate 310.

The transistor of the high-cost semiconductor substrate 320 is a high voltage field-effect transistor having high power handling capability or a high voltage bipolar transistor having high power handling capability and outputs an amplified high power microwave signal, thus involving increased heat generation. The low-cost semiconductor substrate 310 may be mounted with a transistor that is a low voltage transistor compared with the transistor of the high-cost semiconductor substrate 320 so that the low-cost semiconductor substrate 310 generates less heat than the high-cost semiconductor substrate 320.

As illustrated in FIG. 6, signal pads 341 of the low-cost semiconductor substrate 310 are disposed to face signal pads 342 of the high-cost semiconductor substrate 320 and are connected to the signal pads 342 by flip chip bonding using fine bonding members 330. Thus, a surface pattern 313 and a surface pattern 314 of the low-cost semiconductor substrate 310 are electrically connected to the signal pads 342 via the signal pads 341 and the fine bonding members 330.

The heat spreader 7A is provided at the other Y-axis end face 320b of the high-cost semiconductor substrate 320. The high-cost semiconductor substrate 320 is thermally and electrically connected to one Y-axis end face 7Aa of the heat spreader 7A. The heat spreader 7A is thermally and electrically connected to the conductive film 2 as with the heat spreader 7 illustrated in FIG. 1.

As illustrated in FIG. 7, ground through holes 370 are provided as first ground through holes in the low-cost semiconductor substrate 310. Ground planes 377 that are metal layers are provided at one Y-axis end face 310a of the low-cost semiconductor substrate 310. On the ground planes 377, ground pads 372 are provided. Ground pads 373 are provided at the other Y-axis end face 310b of the low-cost semiconductor substrate 310.

The ground through holes 370 are electrically connected to the ground planes 377 and the ground pads 372. The ground pads 372 are electrically connected to the ground terminals 92 on the first plate surface 1a of the multilayer resin substrate 1 via fine bonding members 30, the ground pads 91, and the ground via holes 90.

As illustrated in FIG. 7, ground through holes 371 are provided as second ground through holes in the high-cost semiconductor substrate 320. Ground pads 374 are provided at one Y-axis end face 320a of the high-cost semiconductor substrate 320. A ground plane 378 that is a metal layer is provided at the other Y-axis end face 320b of the high-cost semiconductor substrate 320.

The ground through holes 371 are electrically connected to the ground pads 374 and to the ground plane 378. The ground pads 374 are electrically connected to fine bonding members 330 and to the ground pads 373 on the other Y-axis end face 310b of the low-cost semiconductor substrate 310. The ground plane 378 provided on the other Y-axis end face 320b of the high-cost semiconductor substrate 320 is thermally and electrically connected to the one Y-axis end face 7Aa of the heat spreader 7A.

The conductive film 2 of the microwave device 100-1 having the above-described configuration is electrically connected to the ground via holes 70 of the multilayer resin substrate 1 via the heat spreader 5 and the ground through holes 75 of the IC 4. The conductive film 2 is also electrically connected to the ground via holes 90 of the multilayer resin substrate 1 via the heat spreader 7A, the ground through holes 371, and the ground through holes 370.

This means that for the microwave device 100-1 having the above-described configuration, the ground pattern 19 on the first plate surface 1a of the multilayer resin substrate 1, the ground via holes 70 of the multilayer resin substrate 1, the ground pads 71 on the multilayer resin substrate 1, the ground terminals 72 on the multilayer resin substrate 1, the ground via holes 90 of the multilayer resin substrate 1, the ground pads 91 on the multilayer resin substrate 1, the ground terminals 92 on the multilayer resin substrate 1, the ground pads 372 on the low-cost semiconductor substrate 310, the ground planes 377 on the low-cost semiconductor substrate 310, the ground through holes 370 of the low-cost semiconductor substrate 310, the ground pads 373 on the low-cost semiconductor substrate 310, the ground pads 374 on the high-cost semiconductor substrate 320, the ground through holes 371 of the high-cost semiconductor substrate 320, the ground plane 378 on the high-cost semiconductor substrate 320, the ground pads 73 on the IC 4, the ground through holes 75 of the IC 4, the ground plane 77 on the IC 4, the heat spreader 5, the heat spreader 7A, and the conductive film 2 are all electrically connected and kept at the same potential as the ground potential, which is the potential of the ground pattern 19.

An input and output terminal 311 is provided on the low-cost semiconductor substrate 310 and is electrically connected to the surface pattern 313 via a through hole 315 formed in the low-cost semiconductor substrate 310. The input and output terminal 311 is also electrically connected to the pad 18 on the multilayer resin substrate 1 via the fine bonding member 30.

An input and output terminal 312 is provided on the low-cost semiconductor substrate 310 and is electrically connected to the surface pattern 314 via a through hole 316 formed in the low-cost semiconductor substrate 310. The input and output terminal 312 is also electrically connected to the pad 17 on the multilayer resin substrate 1 via the fine bonding member 30.

The input and output terminal 312, the fine bonding member 30, the pad 17, the signal via hole 13, and the signal input and output terminal 21 compose a signal terminal unit of coaxial structure and are connected to an RF transmission line 119 that is described later. The input and output terminal 41, the fine bonding member 30, the pad 16, the signal via hole 12, and the signal input and output terminal 20 similarly compose a signal terminal unit of coaxial structure.

The antenna 500-1 illustrated in FIG. 8 differs from the antenna 500 illustrated in FIG. 4 in that the antenna 500-1 includes a microwave module 200-1 in place of the microwave module 200.

The microwave module 200-1 includes an antenna substrate 450, a conductive chassis 420, and the multilayer resin substrate 110. Grooves 421 are formed in the conductive chassis 420 to allow component mountings. The grooves 421 are made, for example, by machining of the conductive chassis 420, diffusion bonding, or three-dimensional forming that involves sintering of metal powder. The antenna substrate 450, the conductive chassis 420, and the multilayer resin substrate 110 are disposed in the Y-axis direction in this order.

A plurality of the microwave devices 100-1, the control IC 120, and the chip component 130 are provided at the one Y-axis end face 110a of the multilayer resin substrate 110. A plurality of circulators 400 and a control IC 410 are surface mounted on the other Y-axis end face 110b of the multilayer resin substrate 110. Each of the circulators 400 is housed in the groove 421 of the conductive chassis 420 and electrically connects the conductive chassis 420 and a ground plane on the other Y-axis end face 110b of the multilayer resin substrate 110, thus forming a shielding structure.

The conductive chassis 420 includes an RE connector 470, and the RF connector 470 is electrically connected to the antenna element 210 provided on the antenna substrate 450.

The multilayer resin substrate 110 includes an RF transmission line 118 and the RF transmission line 119. The RF transmission lines 118 and 119 are inner layer signal lines. The circulator 400 is connected to the RF connector 470 via the RF transmission line 118. The circulator 400 is also connected to the microwave device 100-1 via the RF transmission line 119.

The above-described antenna 500 illustrated in FIG. 4 and the above-described antenna 500-1 illustrated in FIG. 8 each have the heat sink 140, the microwave module 200 or 200-1, and the plurality of antenna elements 210 in layers. Thus, the antennas 500 and 500-1 are each capable of having a reduced Y-axis thickness and being smaller and lighter.

The microwave device 100 according to the embodiment has the ICs 4 and 6, the heat spreaders 5 and 7, the conductive film 2, and the heat sink 140 that are thermally connected. The sectional area of the heat spreader 5 taken along the X-axis direction is greater than or equal to the sectional area of the IC 4 taken along the X-axis direction. The sectional area of the heat spreader 7 taken along the X-axis direction is greater than or equal to the sectional area of the IC 6 taken along the X-axis direction. For a semiconductor package disclosed, for example, in Japanese Patent Application Laid-open No. 2013-207132, the sectional area of each back-side penetrating electrode provided in a back-side cap portion is smaller than the surface area of a corresponding back electrode provided on a semiconductor chip. Therefore, heat generated at the semiconductor chip cannot be effectively dissipated out of the semiconductor package. By contrast, the heat spreaders 5 and 7 used in the microwave device 100 according to the embodiment have larger sectional areas, so that thermal resistance between the IC 4 and the heat sink 140 as well as between the IC 6 and the heat sink 140 is reduced. Therefore, effective transmission of heat generated by the ICs 4 and 6 to the heat sink 140 is enabled without interferences among an RF signal that is transmitted between the multilayer resin substrate 1 and the ICs 4 and 6, power, and the control signal.

Moreover, even when the respective conductive films 2 of the microwave devices 100 vary in Y-axis height due to height variations among the microwave devices 100, a warp in the multilayer resin substrate 110, height variations among layers that join the microwave devices 100 to the multilayer resin substrate 110, and the like, the elastic heat dissipation sheet 150 enables thermal connection between the heat dissipation sheet 150 and the conductive films 2 to be ensured.

Since a conventionally adopted method is used for forming the molded resin 50, low-cost manufacture of the microwave device 100 is enabled. In the embodiment, the resin material, which is solidified, surrounds the ICs 4 and 6 and the heat spreaders 5 and 7. Therefore, even when the microwave device 100 is pressed against the heat dissipation sheet 150 to be fixed, pressure is dispersed and is thus applied not only to the ICs 4 and 6 but also to the molded resin 50 via the conductive film 2. This reduces mechanical stress on the terminals of the ICs 4 and 6. Therefore, even when pressing the microwave device 100 against the heat dissipation sheet 150 is involved in fixing of the microwave device 100 to reduce thermal resistance between the IC 4 and the heat dissipation sheet 150 as well as between the IC 6 and the heat dissipation sheet 150, a decline in strength of each mechanical connection between the multilayer resin substrate 1 and each of the ICs 4 and 6 is reduced or eliminated. Consequently, life shortening of the microwave device 100 is reduced or eliminated.

According to the embodiment, the molded resin 50 and the heat spreaders 5 and 7 of the microwave device 100 are surrounded and covered by the conductive film 2, the ground via holes 11 of the multilayer resin substrate 1 are electrically connected to the conductive film 2, and the signal terminal unit 84 of coaxial structure is connected to the signal terminal unit 115 of coaxial structure of the multilayer resin substrate 110, while the signal terminal unit 85 of coaxial structure is connected to the signal terminal unit 121 of coaxial structure of the multilayer resin substrate 110. Therefore, electromagnetic wave radiation produced by each IC 4 or 6 is confined in the microwave device 100. Accordingly, the entire microwave module 200 does not need to be covered by a shield. This enables the microwave module 200 to have a simplified configuration.

When the microwave device 100 houses the plurality of ICs 4 and 6 as described in the embodiment, the microwave device 100 is about 10 mm square or has a bigger size. If the above-described heat spreader 5, which is short-circuited to the ground pattern 19 through the ground through holes 75 in the IC 4, and the above-described heat spreader 7, which is short-circuited to the ground pattern 19 through the ground through holes 95 in the IC 6, are not provided in the package having the conductive covering, cavity resonance frequency decreases to near an X band (10 GHz). In a specific example in which a mold size, that is to say, a cavity size is 10 mm×10 mm×1 mm with the molded resin having its entire outer periphery covered by the conductor, a lowest order resonance frequency is 11.33 GHZ when the mold material has a dielectric constant of 3.5. In this case, isolation is insufficient between the signal input and output terminals 20 and 21, so that the device cannot be operated in the X band. In the embodiment, with the presence of the conductive heat spreaders 5 and 7 each having the ground potential, in the package, short-circuiting is effected inside the microwave device 100 via the ICs 4 and 6 and the ground via holes 70 and 90 of the multilayer resin substrate 1, so that a smaller pseudo cavity size is provided. The smaller pseudo cavity size enables the resonance frequency to be set sufficiently higher than an operating frequency and thus enables undesired characteristics including ripple and oscillation that may be caused by RF signal coupling in the microwave device 100 to be reduced or eliminated.

Figure 9:
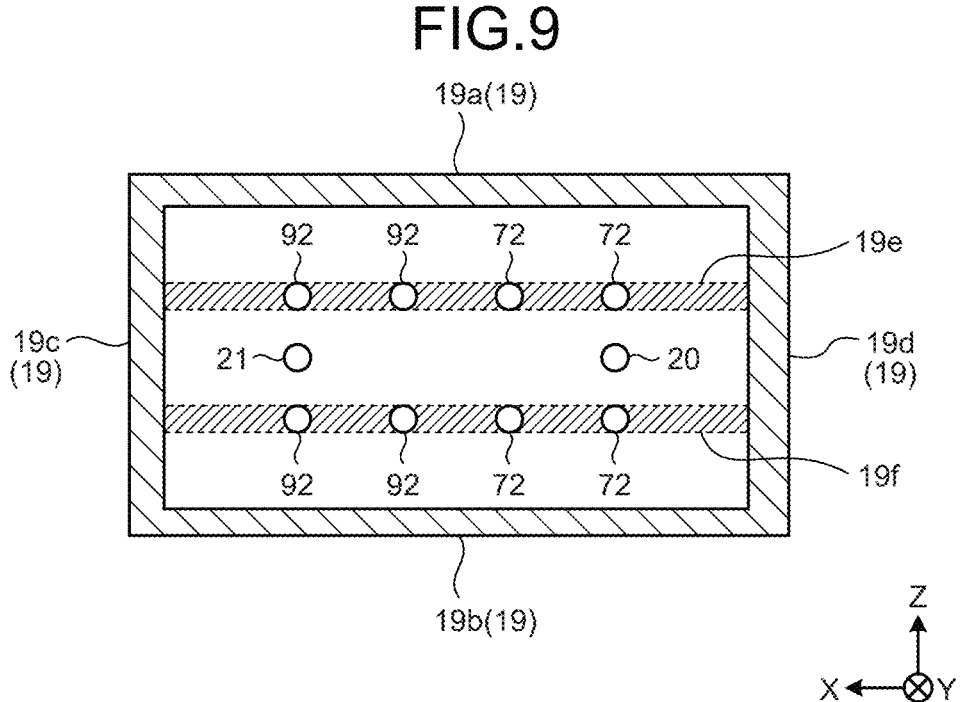
FIG. 9 is a schematic diagram describing a pseudo cavity in the microwave device illustrated in FIG. 1.

A description is provided here of the pseudo cavity size of the microwave device 100. FIG. 9 is a schematic diagram describing the pseudo cavity size of the microwave device 100 illustrated in FIG. 1. FIG. 9 schematically illustrates the microwave device 100 in FIG. 1 viewed from the first plate surface 1a of the multilayer resin substrate 1.

The ground pattern 19 is the conductor pattern of continuous loop shape provided along the outer peripheral portion of the first plate surface 1a of the multilayer resin substrate 1. The microwave device 100 has a first electromagnetic shielding structure that is composed of the conductive film 2, the ground pattern 14, the ground via holes 11, and the ground pattern 19.

A consideration is given here to the first electromagnetic shielding structure in an XZ plane, namely, in the first plate surface 1a of the multilayer resin substrate 1. In the XZ plane, the first electromagnetic shielding structure is defined by an electromagnetic shielding wall 19a along the X-axis direction, an electromagnetic shielding wall 19b along the X-axis direction, an electromagnetic shielding wall 19c along the Z-axis direction, and an electromagnetic shielding wall 19d along the Z-axis direction.

With the above-mentioned ground terminals 72 and 92 provided, a pseudo electromagnetic shielding wall 19e and a pseudo electromagnetic shielding wall 19f are defined along the X-axis direction. The signal input and output terminals 20 and 21 are between the pseudo electromagnetic shielding walls 19e and 19f, which are arranged in the Z-axis direction. Positions of the pseudo electromagnetic shielding walls 19e and 19f are where the electromagnetic shielding walls 19a and 19b would be when brought closer to each other along the Z-axis direction.

Therefore, in the XZ plane, a pseudo electromagnetic shielding structure is defined by the electromagnetic shielding wall 19c, the electromagnetic shielding wall 19d, the pseudo electromagnetic shielding wall 19e, and the pseudo electromagnetic shielding wall 19f. Accordingly, the cavity size is smaller in the XZ plane.

As described above, the ground terminals 72, the ground via holes 70 of the multilayer resin substrate 1, the ground pads 71 on the multilayer resin substrate 1, the fine bonding members 30, the ground pads 73 on the IC 4, the ground through holes 75 of the IC 4, the ground plane 77 on the IC 4, the heat spreader 5, and the conductive film 2 are electrically connected and kept at the same potential as the ground potential, which is the potential of the ground pattern 19.

Similarly, the ground terminals 92, the ground via holes 90 of the multilayer resin substrate 1, the ground pads 91 on the multilayer resin substrate 1, the fine bonding members 30, the ground pads 93 on the IC 6, the ground through holes 95 of the IC 6, the ground plane 97 on the IC 6, the heat spreader 7, and the conductive film 2 are electrically connected and kept at the same potential as the ground potential, which is the potential of the ground pattern 19. Therefore, pseudo electromagnetic shielding surfaces are defined along the pseudo electromagnetic shielding walls 19e and 19f in the Y-axis direction of FIG. 9.

Thus, the pseudo electromagnetic shielding structure is composed of the pseudo electromagnetic shielding surface along the pseudo electromagnetic shielding wall 19e, the pseudo electromagnetic shielding surface along the pseudo electromagnetic shielding wall 19f, and the conductive film 2, and this pseudo electromagnetic shielding structure is a second electromagnetic shielding structure of the microwave device 100.

Since the second electromagnetic shielding structure is smaller than the first electromagnetic shielding structure, the cavity size is smaller, meaning that a cavity space is smaller, thus providing the above-stated effect.

In this way, the microwave device 100 is capable of preventing the ICs 4 and 6, which are provided in an internal area of the conductive film 2 serving as the covering, from operating unstably due to cavity resonance and therefore is capable of stable operation. Similarly, the microwave device 100-1 is capable of preventing the high frequency circuits, which are mounted on the low-cost and high-cost semiconductor substrates 310 and 320 provided in an internal area of the conductive film 2 serving as the covering, from operating unstably due to cavity resonance and therefore is capable of stable operation.

While a loss between the microwave device 100 and the antenna element 210 needs to be minimized, a certain loss is tolerated between the microwave device 100 and the transceiver 600. This enables, in manufacture of the antenna 500, routing the RF lines inside the multilayer resin substrate 110, putting together a plurality of the RF connectors 180 in a location where heat dissipation performance is less affected, and then passing the plurality of the RF connectors 180 through the heat sink 140. Thus, the heat sink 140 can be designed with emphasis put on heat dissipation performance of the heat spreaders 5 and 7. Depending on the specifications of the antenna 500, the RF signal transmission paths may be distributed and combined inside the multilayer resin substrate 110 to achieve a smaller number of RF connectors extending through the heat sink 140.

In the embodiment, the multilayer resin substrate 110 is provided with the CIR or the switch, which is used in the antenna-side duplexer circuit, and is provided with, on its reverse face, the antenna elements 210. This enables the microwave module 200 to integrally have the antenna elements and results in a reduced parts count.

In FIG. 6, only the transistor is mounted on the high-cost semiconductor substrate 320 of the microwave device 100-1, so that a minimized chip area is provided. Since the low-cost semiconductor substrate 310 is provided with the matching circuit, the microwave device 100-1 enables cost reduction compared to the case with the IC 6 of FIG. 1 that has a transistor and matching circuit monolithically made on the high-cost semiconductor substrate 320.

The antenna 500-1 illustrated in FIG. 8 uses the circulators 400 external to the microwave devices 100-1. The circulators 400 are provided at the other Y-axis end face 110b of the multilayer resin substrate 110 that faces the antenna elements 210. This enables characteristic changes of the ICs 4 that are attributed to load impedance variations at an antenna surface to be reduced.

Although each of the circulators 400 of the antenna 500-1 illustrated in FIG. 8 is housed in the groove 421 of the conductive chassis 420, applying a shielding structure that is similar to that of the microwave device 100 or 100-1 to each of the circulators 400 enables each groove 421 to have a simplified shielding structure with respect to the conductive chassis 420. Moreover, mounting the circulators 400 and the control IC 410 on the same plane as the microwave devices 100-1 enables the multilayer resin substrate 110 and the antenna substrate 450 to be integrated as in the antenna 500.

Since the multilayer resin substrate 110 of the antenna 500-1 illustrated in FIG. 8 has the heat sink 140 disposed at the face opposite from its face at which the antenna elements 210 are disposed, constraints on the disposition of the RF lines and the RF connectors 180 are reduced compared to when the heat sink 140 is disposed between the multilayer resin substrate 110 and the antenna substrate 450. Thus, the cooling performance improves.

The above configurations illustrated in the embodiments are illustrative of contents of the present invention, can be combined with other techniques that are publicly known and can be partly omitted or changed without departing from the gist of the present invention.

REFERENCE SIGNS LIST

1, 110 multilayer resin substrate; 1a first plate surface; 1b second plate surface; 2 conductive film; 2a inner face; 3 space; 4, 6 IC; 4a, 5a, 6a, 7a, 7Aa, 110a, 310a, 320a one end face; 4b, 5b, 6b, 7b, 110b, 310b, 320b the other end face; 5, 7, 7A heat spreader; 8, 130 chip component; 11, 70, 90 ground via hole; 12, 13 signal via hole; 14, 19 ground pattern; 15 signal line; 16, 17, 18 pad; 19a, 19b, 19c, 19d, 19e, 19f electromagnetic shielding wall; 20, 21 signal input and output terminal; 30, 330 fine bonding member; 41, 42, 61, 62, 311, 312 input and output terminal; 50 molded resin; 71, 73, 91, 93, 372, 373, 374 ground pad; 72, 92 ground terminal; 75, 95, 370, 371 ground through hole; 77, 97, 377, 378 ground plane; 84, 85, 115, 121 signal terminal unit; 100, 100-1 microwave device; 116, 117, 118, 119 RF transmission line; 120 control IC; 140 heat sink; 150 heat dissipation sheet; 160 control board; 170 power and control connector; 180, 470 RF connector; 200, 200-1 microwave module; 210 antenna element; 310 low-cost semiconductor substrate; 341, 342 signal pad; 313, 314 surface pattern; 315, 316 through hole; 320 high-cost semiconductor substrate; 400 circulator; 410 control IC; 420 conductive chassis; 421 groove; 450 antenna substrate; 500, 500-1 antenna; 600 transceiver; 700 distribution and synthesis circuit.

The invention claimed is:

1. A microwave device comprising:

a first multilayer resin substrate including a plurality of ground via holes;

a semiconductor substrate at one surface of the first multilayer resin substrate and including a high frequency circuit electrically connected to the first multilayer resin substrate;

a conductive heat spreader at an opposite face of the semiconductor substrate from a face of the semiconductor substrate that faces the first multilayer resin substrate, the conductive heat spreader being electrically connected to the semiconductor substrate;

a resin over the one surface of the first multilayer resin substrate and covering the semiconductor substrate and the conductive heat spreader; and a conductive film covering the resin and the conductive heat spreader and in contact with a face of the conductive heat spreader that faces away from the semiconductor substrate, a heat sink in contact with a heat dissipation sheet at an opposite face of the heat dissipation sheet from a face of the heat dissipation sheet at which the microwave device is disposed; and a control board at an opposite side of the heat sink from a side of the heat sink at which the heat dissipation sheet is disposed, the control board being electrically connected to the microwave device, wherein the microwave device is connected to the control board via a first connector, and the microwave device is connected, via a second connector, to a transceiver disposed integrally with or separately from the control board, wherein the semiconductor substrate includes a plurality of ground through holes extending through the semiconductor substrate in a stacking direction in which the first multilayer resin substrate, the semiconductor substrate, and the conductive heat spreader are stacked, the ground through holes being arranged within a surface of the semiconductor substrate, the first multilayer resin substrate includes:

a first ground pattern in an outer peripheral portion of another surface of the first multilayer resin substrate, and a second ground pattern in an inner area within the another surface, the another surface of the of the first multilayer resin substrate being opposite the one surface of the first multilayer resin substrate, the plurality of ground via holes of the first multilayer resin substrate include:

a plurality of first ground via holes at a position corresponding to the outer peripheral portion of the another surface in the first multilayer resin substrate and electrically connected to the conductive film and the first ground pattern provided in the outer peripheral portion, and a plurality of second ground via holes arranged in a distributed manner in the inner area within the another surface in the first multilayer resin substrate and electrically connected to the ground through holes within the semiconductor substrate and the second ground pattern in the inner area within the another surface, the conductive film is electrically connected to the first ground pattern in the outer peripheral portion via the first ground via holes, and is electrically connected to the second ground pattern provided in the inner area within the another surface via the conductive heat spreader, the ground through holes of the semiconductor substrate, and the second ground via holes, the resin is directly in contact with an outer side surface of the conductive heat spreader in a same vertical plane as an outer side surface of the semiconductor substrate, a microwave signal line via hole is coaxially surrounded by the plurality of second ground via holes, the ground through holes within the semiconductor substrate contacting the conductive heat spreader and the second ground via holes within the first multilayer resin substrate are arranged to implement electromagnetic shielding walls in a region surrounded by the conductive film and the first ground via holes, and in a side sectional view, the microwave signal line via hole is between a pair of the plurality of second ground via holes in a direction perpendicular to the stacking direction.

2. An antenna comprising:

a second multilayer resin substrate;

the microwave device according to claim 1, the microwave device being at the second multilayer resin substrate and electrically connected to the second multilayer resin substrate; and the heat dissipation sheet facing the second multilayer resin substrate and in contact with the conductive film of the microwave device.

3. The antenna according to claim 2, wherein the heat dissipation sheet has a smaller elastic modulus than conductive film.

4. The antenna according to claim 2, further comprising:

a conductive chassis at an opposite face of the second multilayer resin substrate from a face of the second multilayer resin substrate at which the microwave device is disposed; and an antenna substrate at an opposite side of the conductive chassis from a side of the conductive chassis at which the second multilayer resin substrate is disposed, the antenna substrate including a plurality of antenna elements, wherein the plurality of antenna elements are connected to the transceiver via the microwave device.

5. The antenna according to claim 4, wherein the side of the conductive chassis at which the second multilayer resin substrate is disposed includes a groove housing a component mounted on the second multilayer resin substrate, the side of the conductive chassis on which the groove is formed is in contact with a ground plane of the second multilayer resin substrate, and the plurality of antenna elements are connected to the transceiver via a high frequency connector of the conductive chassis and the microwave device.

6. The microwave device according to claim 1, wherein the first ground patterning in the outer peripheral portion has a continuous loop shape in a top plan cross-sectional view of the first multilayer resin.

7. The microwave device according to claim 1, wherein the conductive film extends in the stacking direction at the outer peripheral portion, and an outer surface of the conductive film is exposed.

8. The microwave device according to claim 1, wherein a chip component mounted on the first multilayer resin substrate is within the resin.

9. A microwave device comprising:

a first multilayer resin substrate including a plurality of ground via holes;

a first semiconductor substrate at one surface of the first multilayer resin substrate and including a high frequency circuit electrically connected to the first multilayer resin substrate;

a second semiconductor substrate at an opposite face of the first semiconductor substrate from a face of the first semiconductor substrate that faces the first multilayer resin substrate, the second semiconductor substrate including a high frequency circuit electrically connected to the first semiconductor substrate;

a conductive heat spreader at an opposite face of the second semiconductor substrate from a face of the second semiconductor substrate that faces the first semiconductor substrate, the conductive heat spreader being electrically connected to the second semiconductor substrate;

a resin over the one surface of the first multilayer resin substrate and covering the first semiconductor substrate, the second semiconductor substrate, and the conductive heat spreader;

a conductive film covering the resin and the conductive heat spreader and in contact with a face of the conductive heat spreader that faces away from the semiconductor substrate, wherein the first semiconductor substrate includes a plurality of first ground through holes extending through the first semiconductor substrate in a stacking direction in which the first multilayer resin substrate, the first semiconductor substrate, the second semiconductor substrate, and the conductive heat spreader are stacked, the first ground through holes being arranged within a surface of the first semiconductor substrate, the second semiconductor substrate includes a plurality of second ground through holes extending through the second semiconductor substrate in the stacking direction, the second ground through holes being arranged within a surface of the second semiconductor substrate, the first multilayer resin substrate includes first ground patterning in an outer peripheral portion of another surface of the first multilayer resin substrate and second ground patterning in an inner area within the another surface, the another surface being opposite the one surface, the plurality of ground via holes include:

a plurality of first ground via holes at a position corresponding to the outer peripheral portion of the another surface in the first multilayer resin substrate and electrically connected to the conductive film and the first ground patterning in the outer peripheral portion, and a plurality of second ground via holes arranged in a distributed manner in the inner area within the another surface in the first multilayer resin substrate and electrically connected to the first ground through holes and the second ground patterning in the inner area within the another surface, the conductive film is electrically connected to the first ground patterning in the outer peripheral portion via the first ground via holes and is electrically connected to the second ground patterning in the inner area within the another surface via the conductive heat spreader, the first ground through holes, the second ground through holes, and the second ground via holes, and the resin is directly in contact with a side surface of the conductive heat spreader.

10. The microwave device according to claim 9, wherein the second semiconductor substrate includes a transistor made of gallium nitride.

11. The microwave device according to claim 9, wherein the first semiconductor substrate includes a circuit made of gallium arsenide.

12. The microwave device according to claim 9, wherein the first ground patterning in the outer peripheral portion has a continuous loop shape in a top plan cross-sectional view of the first multilayer resin.

13. An antenna comprising:

a second multilayer resin substrate;

the microwave device according to claim 9, the microwave device being at the second multilayer resin substrate and electrically connected to the second multilayer resin substrate; and a heat dissipation sheet facing the second multilayer resin substrate and in contact with the conductive film of the microwave device.

14. The antenna according to claim 13, wherein the heat dissipation sheet has a smaller elastic modulus than the conductive film.

15. The antenna according to claim 13, further comprising:

a heat sink in contact with the heat dissipation sheet at an opposite face of the heat dissipation sheet from a face of the heat dissipation sheet at which the microwave device is disposed; and a control board at an opposite side of the heat sink from a side of the heat sink at which the heat dissipation sheet is disposed, the control board being electrically connected to the microwave device, wherein the microwave device is connected to the control board via a first connector, and the microwave device is connected, via a second connector, to a transceiver disposed integrally with or separately from the control board.

16. The antenna according to claim 15, further comprising:

a conductive chassis at an opposite face of the second multilayer resin substrate from a face of the second multilayer resin substrate at which the microwave device is disposed; and an antenna substrate at an opposite side of the conductive chassis from a side of the conductive chassis at which the second multilayer resin substrate is disposed, the antenna substrate including a plurality of antenna elements, wherein the plurality of antenna elements are connected to the transceiver via the microwave device.

17. The antenna according to claim 16, wherein the side of the conductive chassis at which the second multilayer resin substrate is disposed includes a groove housing a component mounted on the second multilayer resin substrate, the side of the conductive chassis on which the groove is formed is in contact with a ground plane of the second multilayer resin substrate, and the plurality of antenna elements are connected to the transceiver via a high frequency connector of the conductive chassis and the microwave device.

18. The microwave device according to claim 9, wherein the conductive film extends in the stacking direction at the outer peripheral portion, and an outer surface of the conductive film is exposed.

19. The microwave device according to claim 9, wherein a chip component mounted on the first multilayer resin substrate is within the resin.

20. An antenna comprising:

a microwave device;

a heat sink in contact with a heat dissipation sheet at an opposite face of the heat dissipation sheet from a face of the heat dissipation sheet at which the microwave device is disposed; and a control board at an opposite side of the heat sink from a side of the heat sink at which the heat dissipation sheet is disposed, the control board being electrically connected to the microwave device, wherein the microwave device is connected to the control board via a first connector, and the microwave device is connected, via a second connector, to a transceiver disposed integrally with or separately from the control board, the microwave device includes:

a first multilayer resin substrate including a plurality of ground via holes, a semiconductor substrate at one surface of the first multilayer resin substrate and including a high frequency circuit electrically connected to the first multilayer resin substrate, a conductive heat spreader at an opposite face of the semiconductor substrate from a face of the semiconductor substrate that faces the first multilayer resin substrate, the conductive heat spreader being electrically connected to the semiconductor substrate, a resin over the one surface of the first multilayer resin substrate and covering the semiconductor substrate and the conductive heat spreader, and a conductive film covering the resin and the conductive heat spreader and in contact with a face of the conductive heat spreader that faces away from the semiconductor substrate, wherein the semiconductor substrate includes a plurality of ground through holes extending through the semiconductor substrate in a stacking direction in which the first multilayer resin substrate, the semiconductor substrate, and the conductive heat spreader are stacked, the ground through holes being arranged within a surface of the semiconductor substrate, the first multilayer resin substrate includes:

a first ground pattern in an outer peripheral portion of another surface of the first multilayer resin substrate, and a second ground pattern in an inner area within the another surface, the another surface of the first multilayer resin substrate being opposite the one surface of the first multilayer resin substrate, the plurality of ground via holes of the first multilayer resin substrate include:

a plurality of first ground via holes at a position corresponding to the outer peripheral portion of the another surface in the first multilayer resin substrate and electrically connected to the conductive film and the first ground pattern provided in the outer peripheral portion, and a plurality of second ground via holes arranged in a distributed manner in the inner area within the another surface in the first multilayer resin substrate and electrically connected to the ground through holes within the semiconductor substrate and the second ground pattern in the inner area within the another surface, the conductive film is electrically connected to the first ground pattern in the outer peripheral portion via the first ground via holes, and is electrically connected to the second ground pattern provided in the inner area within the another surface via the conductive heat spreader, the ground through holes of the semiconductor substrate, and the second ground via holes, the resin is directly in contact with an outer side surface of the conductive heat spreader in a same vertical plane as an outer side surface of the semiconductor substrate, a microwave signal line via hole is coaxially surrounded by the plurality of second ground via holes, the ground through holes within the semiconductor substrate contacting the conductive heat spreader and the second ground via holes within the first multilayer resin substrate are arranged to implement electromagnetic shielding walls in a region surrounded by the conductive film and the first ground via holes, and in a side sectional view, the microwave signal line via hole is between a pair of the plurality of second ground via holes in a direction perpendicular to the stacking direction.

21. An antenna comprising:

a microwave device;

a first multilayer resin substrate and a conductive film;

a second multilayer resin substrate;

a heat dissipation sheet facing the second multilayer resin substrate and in contact with the conductive film of the microwave device;

a heat sink in contact with the heat dissipation sheet at an opposite face of the heat dissipation sheet from a face of the heat dissipation sheet at which the microwave device is disposed; and a control board at an opposite side of the heat sink from a side of the heat sink at which the heat dissipation sheet is disposed, the control board being electrically connected to the microwave device, wherein the microwave device is at the second multilayer resin substrate and electrically connected to the second multilayer resin substrate;

the microwave device is connected to the control board via a first connector, and the microwave device is connected, via a second connector, to a transceiver disposed integrally with or separately from the control board, wherein the microwave device includes:

the first multilayer resin substrate including a plurality of ground via holes, a semiconductor substrate at one surface of the first multilayer resin substrate and including a high frequency circuit electrically connected to the first multilayer resin substrate, a conductive heat spreader at an opposite face of the semiconductor substrate from a face of the semiconductor substrate that faces the first multilayer resin substrate, the conductive heat spreader being electrically connected to the semiconductor substrate, a resin over the one surface of the first multilayer resin substrate and covering the semiconductor substrate and the conductive heat spreader; and the conductive film covers the resin and the conductive heat spreader and is in contact with a face of the conductive heat spreader that faces away from the semiconductor substrate, the semiconductor substrate includes a plurality of ground through holes extending through the semiconductor substrate in a stacking direction in which the first multilayer resin substrate, the semiconductor substrate, and the conductive heat spreader are stacked, the ground through holes being arranged within a surface of the semiconductor substrate, the first multilayer resin substrate includes:

a first ground pattern in an outer peripheral portion of another surface of the first multilayer resin substrate, and a second ground pattern in an inner area within the another surface, the another surface of the first multilayer resin substrate being opposite the one surface of the first multilayer resin substrate, the plurality of ground via boles of the first multilayer resin substrate include:

a plurality of first ground via holes at a position corresponding to the outer peripheral portion of the another surface in the first multilayer resin substrate and electrically connected to the conductive film and the first ground pattern provided in the outer peripheral portion, and a plurality of second ground via holes arranged in a distributed manner in the inner area within the another surface in the first multilayer resin substrate and electrically connected to the ground through holes within the semiconductor substrate and the second ground pattern in the inner area within the another surface, the conductive film is electrically connected to the first ground pattern in the outer peripheral portion via the first ground via holes, and is electrically connected to the second ground pattern provided in the inner area within the another surface via the conductive heat spreader, the ground through holes of the semiconductor substrate, and the second ground via holes, the resin is directly in contact with an outer side surface of the conductive heat spreader in a same vertical plane as an outer side surface of the semiconductor substrate, a microwave signal line via hole is coaxially surrounded by the plurality of second ground via holes, the ground through holes within the semiconductor substrate contacting the conductive heat spreader and the second ground via holes within the first multilayer resin substrate are arranged to implement electromagnetic shielding walls in a region surrounded by the conductive film and the first ground via holes, and in a side sectional view, the microwave signal line via hole is between a pair of the plurality of second ground via holes in a direction perpendicular to the stacking direction.

* * * * *